US006614585B1

(12) United States Patent
Burstyn

(10) Patent No.: US 6,614,585 B1
(45) Date of Patent: Sep. 2, 2003

(54) PHASE CONJUGATING STRUCTURE FOR MODE MATCHING IN SUPER LUMINESCENT DIODE CAVITIES

(75) Inventor: Herschel C. Burstyn, Princeton, NJ (US)

(73) Assignee: Trumpf Photonics Inc., Cranbury, NJ (US)

( * ) Notice: Subject to any disclaimer, the term of this patent is extended or adjusted under 35 U.S.C. 154(b) by 0 days.

(21) Appl. No.: 09/566,276

(22) Filed: May 5, 2000

Related U.S. Application Data

(60) Provisional application No. 60/132,791, filed on May 6, 1999.

(51) Int. Cl.[7] .................................................. H01S 3/00
(52) U.S. Cl. ...................................................... 359/333
(58) Field of Search ........................... 372/101, 18, 19, 372/29.022, 29.023; 359/300, 333, 338, 346

(56) References Cited

U.S. PATENT DOCUMENTS

| 4,762,397 | A | * | 8/1988 | Pepper ......................... 349/17 |
| 4,936,660 | A | * | 6/1990 | Clendening et al. ........ 350/354 |
| 5,798,853 | A | * | 8/1998 | Watanabe .................... 359/160 |
| 5,917,972 | A | * | 6/1999 | Davies ......................... 372/50 |
| 5,920,588 | A | * | 7/1999 | Watanabe .................... 359/124 |
| 6,188,705 | B1 | * | 2/2001 | Krainak et al. ........ 250/339.07 |

FOREIGN PATENT DOCUMENTS

| JP | 04 097206 A | | 3/1992 | ............ G02B/6/30 |
| JP | 04-097206 | * | 3/1992 | ............ G02B/6/30 |
| JP | 04 149526 A | | 5/1992 | ............ G02F/1/35 |
| JP | 04-149526 | * | 5/1992 | ............ G02F/1/35 |
| WO | WO 96 09668 A | | 3/1996 | ............ H01S/3/25 |

OTHER PUBLICATIONS

Watanabe et al. Compensation of Chromatic Dispersion in a Single–Mode Fiber by Optical Phase Conjugation. IEEE Photonics Technology Letters, vol. 5. No. 1. Jan. 1993. pp. 92–95.*

Yeh, Pochi. Photorefractive Phase Conjugators. Proceedings of hte IEEE. vol. 80. No. 3. Mar. 1992.*

Kikuchi et al. Compensation for PUlse Waveform Distortion in Ultra–Long Distance Optical Communication Systems by using Midway Optical Phase Conjugator. IEEE Photonics Technology Letters. vol. 6. No. 1. Jan. 1994. pp. 104–105.*

Watanabe et al., "Generation of Optical Phase—Conjugate Waves and Compensation for Pulse Shape Distortion in a Single–Mode Fiber", Journal of Lightwave Technology, vol. 12, No. 12, Dec. 1994, pp. 2139–2146.*

Shiraishi K. Et al.: "Light–Propagation Characteristics in Thermally Diffused Expanded Core Fibers", Journal of Lightwave Technology, US, IEEE, New York, vol. 11, No. 10, Oct. 1, 1993, pp. 1584–1591, XP000418376, ISSN: 0733–8724, p. 1587.

Xiaohiu Ning: "Three Dimensional Ideal 01/02 Angular Transformer and Its Uses in Fiber Optics", Applied Optics, US, Optical Society of America, Washington, vol. 27, No. 19, Oct. 1, 1988, pp. 4126–4130, XP000032348 ISSN: 0003–6935 p. 4130.

Tatham M.C. et al: "Compensation Fibre Chromatic Dispersion by Optical Phase Conjugation in a Semiconductor Laser Amplifier" Electronics Letters, GB, IEE Stevenage, vol. 29, No. 21, Oct. 14, 1993 pp. 1851–1852, XP000406572 ISSN: 0013–5194 the whole document.

* cited by examiner

Primary Examiner—Thomas G. Black
Assistant Examiner—Deandra M. Hughes
(74) Attorney, Agent, or Firm—Fish & Richardson P.C.

(57) ABSTRACT

A mode matching gain element for an optical system is described, that supports a single mode of the optical signal, and that matches the incoming wavefront to a required outgoing wavefront. The incoming wavefront is passed through a phase conjugating structure, and the mode of the gain element is matched to the mode of the input and output optic fibers. The phase conjugating structure includes lenses or mirrors which time-reverse the incoming signal.

21 Claims, 3 Drawing Sheets

PHASE CONJUGATING STRUCTURE FOR MODE MATCHING IN SUPER LUMINESCENT DIODE CAVITIES

This application claims the benefit of U.S. Provisional Application No. 60/132,791, filed May 6, 1999. The present invention is directed to a mode matching gain element connecting two single mode optic fibers, and to a method for performing such mode matching. More specifically, the invention is directed to a phase conjugating structure for mode matching in a super luminescent diode cavity used as a gain element between two single mode optic fibers.

DESCRIPTION OF RELATED ART

Optical circuits often employ devices such as super luminescent diode cavities as gain elements to boost an optical signal traveling through the circuit. These gain elements typically have an input and an output to which optic fibers are connected via a coupler.

The purpose of the gain element is to take the signal entering from the input fiber, boost it, and output the signal to the output fiber. To do this, the gain element must contain a sufficient volume of gain material so that the desired amount of amplification of the signal is obtained. Since the optic fibers have a very small diameter, the gain element usually has a tapered shape, starting at the coupler with a diameter equal to that of the optic fiber, increasing to a much larger diameter, and then decreasing again to the diameter of the output fiber.

A problem occurring with this conventional configuration is shown schematically in FIG. 1. Gain element 14 has an input optic fiber 10 and an output optic fiber 12 connected to it, so that an incoming wave front 16 propagates through gain material 18 from input optic fiber 10. The shape of the incoming wave front 16 however, does not match a shape of an outgoing wave front 17 that the signal must assume in order to exit the gain element 14 through output optic fiber 12. This mismatch causes losses to occur in the gain element.

The severity of this problem can be reduced by making gain element 14 into a very long tapered shape, where the diameter of the taper increases slowly from the diameter of input fiber 10, to a maximum diameter, and back to the diameter of output fiber 12. In this manner, incoming wave front 16 can change adiabatically, or with little loss of energy, from the shape of wave front 16, to essentially a straight line wave front at the largest diameter, and then to the shape of outgoing wave front 17 required to exit through output fiber 12. The problem with this design is that the taper for the gain element is excessively long, and takes up a large amount of space in the optical circuit.

In addition, conventional gain elements, also known as gain tapers, may support multiple modes of the laser light being amplified therein. In particular, when the input and output optic fibers are mono-mode fibers, the additional modes supported by the gain element result in leakage of radiation from the gain element and additional losses of signal.

In view of the foregoing, there is a need for a single mode gain element for optical circuits that has a small size and that matches the mode and the wave front of the incoming signal to that of the outgoing signal, thus avoiding the excessive losses associated with conventional devices.

SUMMARY OF THE INVENTION

The present invention is directed to a mode matching gain element for optical networks that substantially obviates one or more of the problems due to limitations and disadvantages of the related art. Additional features of the invention will be set forth in the description which follows, and in part will be apparent from the description, or may be learned by practice of the invention.

To achieve these and other advantages in accordance with the present invention, the invention is a single mode gain element of an optical system having an input and an output for an optical signal, comprising a gain medium having a geometry adapted to amplify the optical signal and to support a desired optical mode of the optical signal, and a phase conjugating structure, disposed in a path of the optical signal, to time-reverse the optical signal between the input and the output.

In another aspect, the invention is a super luminescent diode cavity, comprising input and output optic fibers capable of supporting a signal of a single optical mode, a gain region to amplify the signal, said gain region supporting the single optical mode, and a phase conjugating region to time reverse the signal between the input and the output optic fibers.

In yet another aspect, the invention is a method of amplifying a signal between an input mono-mode optic fiber and an output mono mode optic fiber, comprising passing the signal through a single mode gain region, said gain region being selected to support an optic mode substantially identical to the mode of the input and output optic fibers, and performing a time-reversal of the signal, to match a wavefront of the signal at the input fiber to a wavefront of the signal at the output fiber.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention, are incorporated in and constitute a part of the specification, illustrate embodiments of the invention and, together with the description, serve to explain the objects, advantages, and principles of the invention.

In the drawings.

DETAILED DESCRIPTION OF THE PREFERRED EMBODIMENTS OF THE INVENTION

The invention provides a structure and a method for matching the mode and the wave front shape of an incoming signal entering the gain element from an input optic fiber, to the wave front shape and mode of an outgoing signal required to enter the output optic fiber with the least possible loss. To minimize the length and bulk of the gain element, a structure capable of producing a phase conjugate of the input wave front is included in the gain element, to perform a time reversal operation on said incoming signal, and match it to the required shape and mode of the outgoing signal traveling away from the gain element through an output optic fiber.

The gain element itself can be formed so that it only supports one mode of the signal being amplified. The input and output optic fibers can also be mono-mode fibers, so that the mode of the mono-mode gain element can be matched to that of the fibers. The gain element can be a semiconductor super luminescent diode, or can be a gaseous-type laser. The phase conjugating structure included in the gain element can be formed by optical elements such as mirrors and lenses, or can be formed by other known means.

Figure 1:
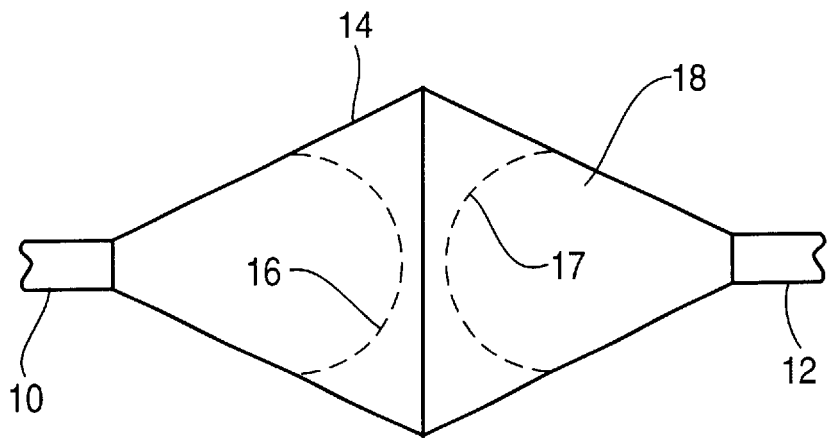
FIG. 1 is a schematic diagram showing a gain element taper connected to an input and an output optic fiber.
Figure 2:
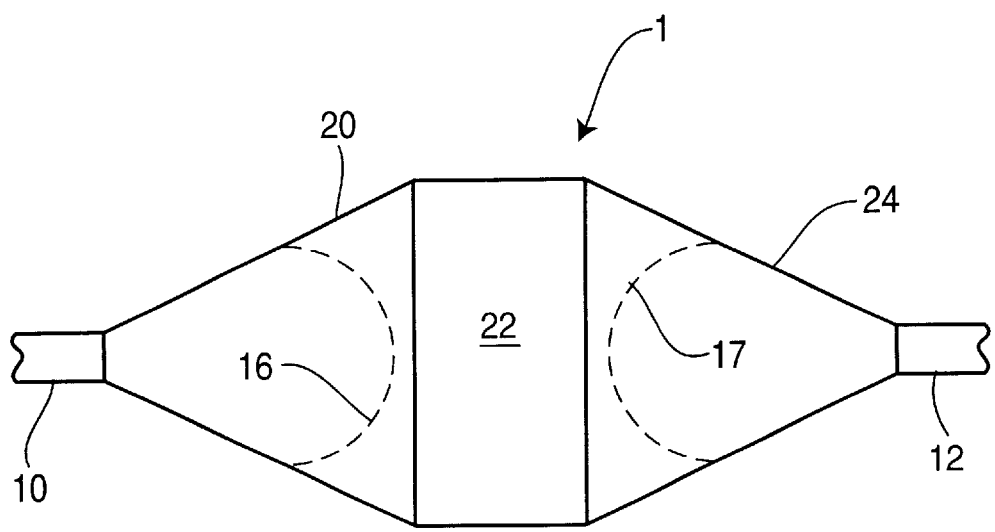
FIG. 2 is a schematic diagram showing a gain element taper with a phase conjugating structure according to the present invention.

FIG. 2 is a schematic diagram showing a gain element taper 1 connecting an input optic fiber 10 to an output optic fiber 12. Incoming wave front 16 travels through a first gain portion 20 of the taper after entering the gain element 1 from input fiber 10. An outgoing wave front 17 travels through a second gain portion 24 of gain element 1, on the way to output optic fiber 12. For example, gain element 1 can be made of InGaAs or of InGaAsP for a semiconductor device, and of HeNe or of Argon for a gaseous device.

In a preferred embodiment, optic fibers 10 and 12 are single-mode optic fibers, supporting only one mode of laser light. More specifically, both input optic fiber 10 and output optic fiber 12 support the same mode. Gain element 1 can have a tapered shape, with the diameter increasing from a diameter matching input optic fiber 10, to a maximum diameter, and then decreasing to the diameter of output optic fiber 12.

This type of taper can be also designed to be a mono-mode structure, so that only one mode of laser light will be supported within such taper. Details of how a taper can be constructed so that it only supports one mode are given in *Model Analysis of a Dielectric Wave Guide with Planar Guiding-Nonguiding Boundaries with a Flare in the Direction of Propagation*, Microwave and Optical Technology Letters, Vol. 17, No. 6, Apr. 20, 1998, by Singh et al. This technical paper is hereby incorporated by reference in its entirety. It is thus possible to form a matching assembly of an input optic fiber, a tapered gain element, and an output optic fiber that will all support the same single mode of a light signal carried therethrough. Since the taper is formed of a gain material, a volume of the taper can be selected to obtain a desired amplification of the signal traveling through gain taper 1 between the input optic fiber 10 and the output optic fiber 12.

FIG. 2 also shows a phase conjugating structure 22 disposed between the first gain portion 20 and the second gain portion 24 of the gain element taper 1. The purpose of phase conjugating structure 22 is to accept the incoming wave front 16, and perform a phase conjugation operation to that wave front. This operation gives the wave front a form that is required to be accepted in output optic fiber 12 with minimal loss, after traveling through second gain portion 24. The operation carried out by phase conjugating structure 22 on the incoming wave front 16 is also commonly referred to as a time reversal of the wave front. The time reversal operation can be carried out in several known ways, for example by optical means such as mirrors and lenses.

The operation performed by the phase conjugating structure can be understood from a theoretical point of view by noting that the wave equation within the gain elements taper 1 can have two solutions. One solution corresponds to wave front 16 emanating from input optic fiber 10, and another solution corresponds to a wave front emanating from output optic fiber 12, that is identical to outgoing wave front 17. The phase conjugating structure 22 transforms the incoming wave front 16 from the first one of those solutions of the wave equation to the other solution, so that the transformed outgoing wave front 17 can proceed into output optic fiber 12 with minimal losses.

Figure 3:
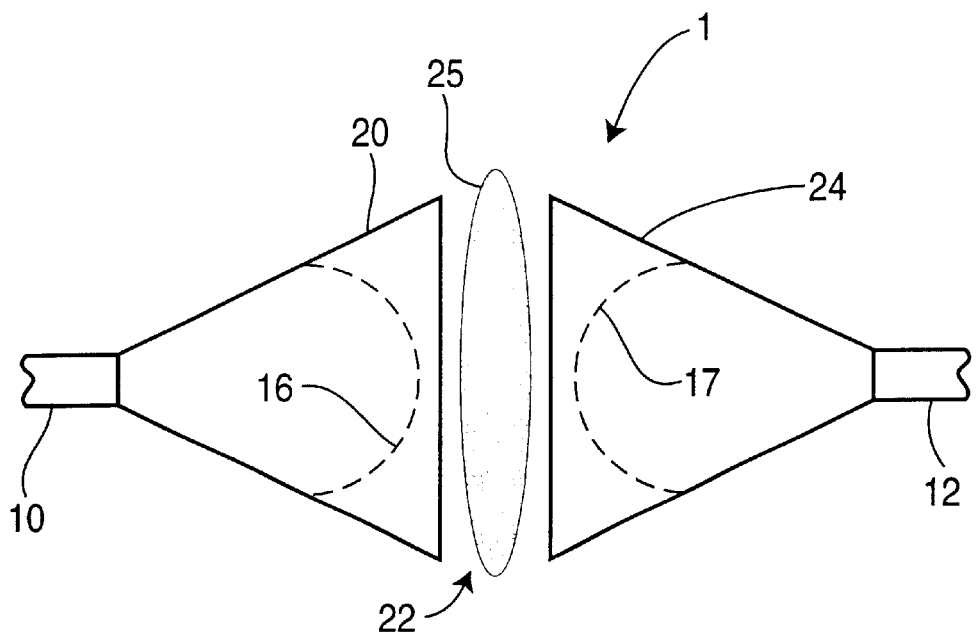
FIG. 3 is a schematic diagram of a gain element taper according to a first embodiment of the present invention, comprising a lens.

FIG. 3 shows one preferred embodiment of the gain element according to the present invention, where the phase conjugating structure 22 is an optical wave conjugating device formed by a lens 25. Lens 25 is shown schematically in FIG. 3, and could be implemented as a doped region of a semiconductor gain material, as a Luneburg lens, or as a surface relief type lens. Any type of known lens capable of performing optical wave conjugation can be used in place of lens 25. FIG. 3 shows a symmetrical arrangement where lens 25 is centered between the tapers 20,24, but the arrangement does not have to be symmetrical. Lens 25 should be centered between the tapers 20, 24 when the lens is of unit magnification. However, if a lens of different magnification is used, lens 25 can be placed in a different location, as long as input and output optic fibers 10, 12 are placed at the optical conjugate points.

Instead of an optical wave conjugating device as shown in FIG. 3, the phase conjugating structure 22 can also be formed in a different manner, depending on the application and the type of gain element being used. For example, if a gas-filled lasing cavity is used as the gain medium, the phase conjugating structure could be implemented by areas of the gas having different indices of refraction. These areas, for example, could be formed by regions of the gas having different temperatures. Alternatively, if the gain element is a semiconductor super luminescent diode, the phase conjugating structure could be implemented with fibers that are either doped or etched, so that they can achieve the desired time reversal of the signal entering the gain element.

In addition to the structures described, a phase conjugate of the signal can be obtained by any other known method. For example, phase conjugating mirrors and media using degenerate 4-wave mixing could be used.

Figure 4:
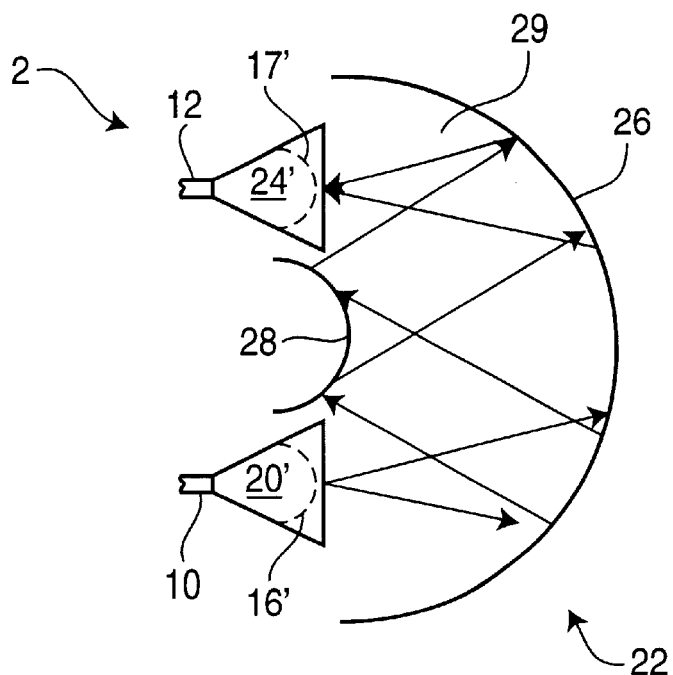
FIG. 4 is a schematic diagram showing a gain element according to a second embodiment of the present invention, which comprises circular mirrors.

FIG. 4 shows schematically another embodiment of a gain element according to the present invention, where the phase conjugating structure is implemented as a different type of optical wave conjugating device. In this embodiment, input optic fiber 10 is connected to a first tapered gain portion 20' of gain element 2, and output optic fiber 12 is connected to a second tapered gain portion 24'. An optic signal enters the gain element 1' from optic fiber 10, with a wave front 16'. The signal then travels through an optical wave conjugating device 22, which is formed by an inner spherical mirror 28 and an outer spherical mirror 26. For example, spherical mirrors 26, 28 can be concentric mirrors, similar to the mirrors used in photolithography. The optical wave conjugating device 22 performs a time reversal of the signal, which is then fed to a second gain element 24' with an outgoing wave front 17'. Couplers can be used to connect the optic fibers to the respective gain elements.

Mirrors 26 and 28 in this embodiment can be made by etching, doping or by other means of forming an index discontinuity. The specific details of the configuration can vary depending on whether the gain element is a super luminescent diode made of silicone, or whether a gas filled lasing cavity is employed. As in the examples shown in FIGS. 2 and 3, tapered gain elements 20' and 24' are designed to sustain a single mode. That single mode can be matched to the single modes of optic fibers 10 and 12.

Figure 5:
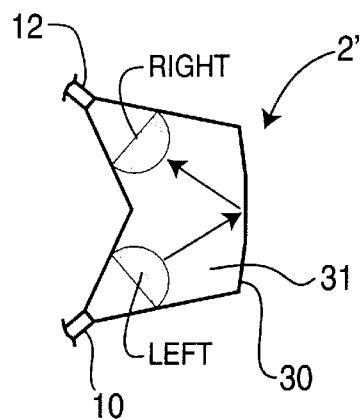
FIG. 5 is a schematic diagram showing a third embodiment of the gain element according to the present invention, which includes an elliptic mirror.

FIG. 5 shows a further embodiment of a gain element according to the present invention. In this embodiment, the signal enters gain element 2' from input optic fiber 10, travels through a gain medium 31, and exits through an output optic fiber 12. An elliptic mirror 30 is disposed in the path of the signal, and is shaped so as to perform time reversal of the signal between input optic fiber 10 and output optic fiber 12. Elliptic mirror 30 thus operates as the optical wave conjugation device in this embodiment of the invention. The configuration of elliptic mirror 30 can be varied to suit the configuration of optic fibers 10, 12, as long as the connections to optic fibers 10, 12 are made at the optical conjugate points of the mirror 30.

The embodiments shown in FIG. 4 and FIG. 5 rely on reflective mirrors to perform the phase conjugation or time reversal of the signal. Those mirrors typically have to be etched and require a metallizing backing to be applied to them, so that they will be able to reflect the incoming signals. Any known method of producing such a mirror for use in a semiconductor device or in a gas based laser device can be applied to form the required mirrors.

Figure 6:
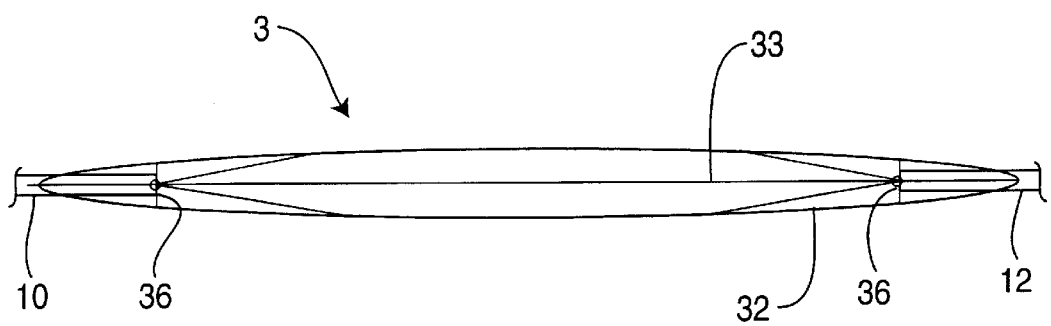
FIG. 6 shows a diagram of a fourth embodiment of the gain element according to the invention, including a parabolic taper.

FIG. 6 shows another embodiment of the mode matching gain element according to the present invention. An input optic fiber 10 and output optic fiber 12 are connected by means of a mode matching gain element 3. In this case, the mode matching gain element 3 has an outer surface 32 that is in the shape of a parabola, with the signal being inserted from input optic fiber 10 via a coupler at one focal point 36 of the parabola, while the outgoing signal is withdrawn via a coupler by output optic fiber 12 at the second focal point 36 of the parabola. The signal traveling between foci 36 is reflected by total internal reflection by the surface 32 of the gain element. The total internal reflection at the parabolic boundary time reverses the wave front, so that the parabolic shape of the gain element 3 acts as an optical wave conjugating device.

One advantage of this embodiment of the invention is that it relies on total internal reflection at the surface 32, so that there is no need to form reflective mirrors by etching and metallizing the back of any of the elements, thus simplifying the manufacturing process of gain element 3. In this embodiment, gain element 3 can contain a gain material 33 of a volume appropriate to obtain the desired amplification of the signal.

Figure 7:
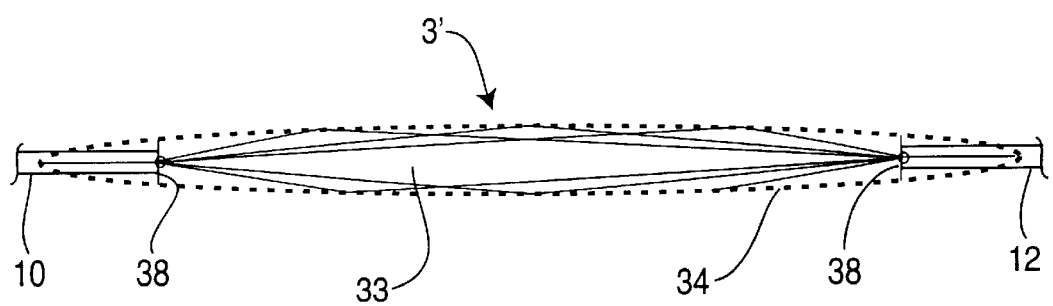
FIG. 7 is a diagram showing a fifth embodiment of the gain element according to the invention, including an elliptical taper.

FIG. 7 shows yet another embodiment of the gain element according to the present invention, which also utilizes total internal reflection. In this case, the gain element 3' is shaped as a highly eccentric ellipse, with couplers for input optic fiber 10 and output optic fiber 12 being attached at the foci 38 of the ellipse. As in the embodiment shown in FIG. 6, the gain material 33 performs the light amplification of the signal traveling between the foci 38, while total internal reflection at the surface 34 of gain element 3' performs the time reversal of the signal.

In both cases of a gain element having a parabolic and an elliptic shape, the surface of the device on which total internal reflection occurs can be either a true parabola or ellipse, or can be an approximation of a true parabola or ellipse formed by faceted surfaces. In general, the more surfaces are employed, and the more closely the shape of surfaces 32, 34 approximates respectively a true parabola and ellipse, the more accurately the time reversal will be performed by this optical wave conjugating device.

As in the embodiment described earlier, the gain elements 3 and 3' can be designed to only support one mode of laser light. This mode can then be matched to the mode of single-mode input and output fibers 10, 12.

The scope of this invention is also intended to encompass a method of amplifying a signal using the device described above. According to the invention, a signal traveling from an input optic fiber 10 to an output optic fiber 12 is amplified by passing through a gain material. A time reversal operation is then performed on the signal by passing it through a phase conjugating structure 22. The wave front of the incoming signal is thus transformed into the appropriate shape required to match the wave front of the outgoing signal. In the case of mono-mode input and output fibers, the gain region through which the signal is amplified is designed to only support one mode of the signal. That one mode is matched to the mode of the input and output fibers, so that the signal can be amplified while maintaining its input mode, and while matching the input wave front to the required output wave front. Losses through the device are thus kept to a minimum.

The signal being amplified in a gain element according to the present invention may also be shifted to a different wavelength than the input signal wavelength. For example, an upconverting gain element can be constructed, that converts the wavelength of the signal from the infra-red range to the visible range. Although the upconverting step is known, the present device can perform the upconversion while matching the mode and wavefront shape of the input signal to that of a desired output signal.

According to the invention, the specific details of the size, amplification power and other parameters of the devices described herein can be selected according to the specific applications for which they are used.

It will be apparent to those skilled in the art that various modifications and variations can be made in the structure and the methodology of the present invention, without departing from the spirit or scope of the invention. Thus, it is intended that the present invention cover the modifications and variations that come within the scope of the independent claims and their equivalents.

What is claimed is:

1. A super luminescent diode cavity comprising:
   input and output optic fibers capable of supporting a signal of a single optical mode;
   a gain region to amplify the signal, said gain region supporting the single optical mode; and
   a lens which is a phase conjugating region to time reverse the signal between the input and the output optic fibers.

2. The super luminescent diode cavity of claim 1, wherein the gain region is adapted to upconvert the signal from a wavelength at the input to a different wavelength at the output.

3. The super luminescent diode cavity of claim 2, wherein the signal is an infrared signal at the input fiber, and the signal is a visible signal at the output fiber.

4. The super luminescent diode cavity of claim 1, wherein the gain region comprises one of an InGaAs layer and an InGaAsP layer.

5. The super luminescent diode cavity of claim 1, wherein the input and output optic fibers are capable of supporting the same optical mode that the gain region supports.

6. The super luminescent diode cavity of claim 1, wherein the phase conjugating region matches a waveform of the signal at the input to a waveform of the signal at the output.

7. A super luminescent diode device comprising:
a first connection to an input optical fiber and a second connection to an output optical fiber; wherein said fibers support a single optical mode;
a diode cavity comprising:
a first gain region to amplify a signal present at said first connection;
a second gain region in communication with said second connection;
a lens between said first and second regions to match a wave front of said signal at said first connection to a wave front at said second connection.

8. The super luminescent diode device of claim 7, wherein the lens is a doped lens.

9. The super luminescent diode device of claim 7, wherein the lens is a Luneburg lens.

10. The super luminescent diode device of claim 7, wherein the lens is a surface relief lens.

11. The super luminescent diode device of claim 7, wherein the first gain region is adapted to upconvert the signal from a wavelength at the first connection to a different wavelength at the second connection.

12. The super luminescent diode device of claim 11, wherein the wavelength at the first connection is an infrared wavelength and the different wavelength at the second connection is a visible wavelength.

13. The super luminescent diode device of claim 7, wherein the second gain region is adapted to upconvert the signal from a wavelength at the first connection to a different wavelength at the second connection.

14. The super luminescent diode device of claim 13, wherein the wavelength at the first connection is an infrared wavelength and the different wavelength at the second connection is a visible wavelength.

15. The super luminescent diode device of claim 7, wherein the first gain region and the second gain region support the single optical mode.

16. The super luminescent diode device of claim 7, wherein the first gain region comprises an InGaAs layer.

17. The super luminescent diode device of claim 7, wherein the first gain region comprises an InGaAsP layer.

18. The super luminescent diode device of claim 7, wherein the second gain region comprises an InGaAs layer.

19. The super luminescent diode device of claim 7, wherein the second gain region comprises an InGaAsP layer.

20. The super luminescent diode device of claim 7, wherein the lens is adapted to time reverse the signal between the first connection an the second connection.

21. The diode laser of claim 1, wherein the lens is one of a doped lens, a Luneburg lens and a surface relief lens.

* * * * *